(12) United States Patent
Mohammed

(10) Patent No.: US 8,412,052 B2
(45) Date of Patent: Apr. 2, 2013

(54) SURFACE MOUNT (SMT) CONNECTOR FOR VCSEL AND PHOTODIODE ARRAYS

(75) Inventor: Edris M. Mohammed, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 620 days.

(21) Appl. No.: 10/971,234

(22) Filed: Oct. 22, 2004

(65) Prior Publication Data

US 2006/0088254 A1    Apr. 27, 2006

(51) Int. Cl.
*H04B 10/00* (2006.01)

(52) U.S. Cl. ........ 398/138; 398/135; 398/136; 398/139; 398/156; 398/164; 398/60; 385/88; 385/89; 385/90; 385/92; 385/93; 385/52

(58) Field of Classification Search ............... 398/135, 398/60, 136, 137, 138, 139, 128, 129, 130, 398/131, 140, 141, 158, 159, 156, 164; 385/88, 385/89, 92, 75, 90, 93, 94, 52, 49, 78

See application file for complete search history.

(56) References Cited

U.S. PATENT DOCUMENTS

| | | | | |
|---|---|---|---|---|
| 4,840,451 A * | 6/1989 | Sampson et al. | ................. | 385/89 |
| 5,448,661 A * | 9/1995 | Takai et al. | ................. | 385/24 |
| 5,528,408 A | 6/1996 | McGinley et al. | | |
| 5,611,013 A * | 3/1997 | Curzio | ................. | 385/89 |
| 5,631,988 A | 5/1997 | Swirhun et al. | | |
| 5,930,428 A | 7/1999 | Irwin et al. | | |
| 6,056,448 A | 5/2000 | Sauter et al. | | |
| 6,318,909 B1 * | 11/2001 | Giboney et al. | ................. | 385/90 |
| 6,485,192 B1 * | 11/2002 | Plotts et al. | ................. | 385/75 |
| 7,217,043 B2 * | 5/2007 | Schunk | ................. | 385/94 |
| 2002/0021871 A1 * | 2/2002 | Auburger et al. | ................. | 385/88 |
| 2002/0172472 A1 | 11/2002 | Nelson et al. | | |
| 2003/0152391 A1 * | 8/2003 | Kuhara et al. | ................. | 398/164 |
| 2003/0161583 A1 | 8/2003 | Kuhara | | |
| 2003/0185484 A1 | 10/2003 | Chakravorty et al. | | |
| 2003/0201462 A1 * | 10/2003 | Pommer et al. | ................. | 257/200 |
| 2003/0210873 A1 | 11/2003 | Moretti | | |
| 2004/0042737 A1 * | 3/2004 | Devine et al. | ................. | 385/89 |
| 2004/0234210 A1 | 11/2004 | Nagasaka et al. | | |

FOREIGN PATENT DOCUMENTS

| | | |
|---|---|---|
| BE | 1 010 495 A3 | 10/1998 |
| EP | 0 062 287 A2 | 10/1982 |
| EP | 0 535 473 A1 | 4/1993 |
| EP | 0 645 651 A1 | 3/1995 |
| JP | 06331854 | 12/1994 |

(Continued)

OTHER PUBLICATIONS

Karstensen, H., "Parallel Optical Links—PAROLI, a Low Cost 12-Channel Optical Interconnection," Lasers and Electro-Optics Society Annual Meeting, IEEE, vol. 1, Oct. 30, 1995, pp. 226-227.

(Continued)

*Primary Examiner* — Hanh Phan

(74) *Attorney, Agent, or Firm* — Blakely, Sokoloff, Taylor & Zafman LLP

(57) ABSTRACT

Self alignment of Optoelectronic (OE) chips, such as photodiode (PD) modules and vertical cavity surface emitting laser (VCSEL) modules, to external waveguides or fiber arrays may be realized by packaging the OE chips directly in the fiber optic connector.

10 Claims, 5 Drawing Sheets

FOREIGN PATENT DOCUMENTS

| | | |
|---|---|---|
| JP | 2002-232054 A2 | 8/2002 |
| JP | 2003-255195 A | 9/2003 |
| JP | 2004-240220 A | 8/2004 |
| WO | 95/34836 A2 | 12/1995 |
| WO | 95/34836 A3 | 5/1996 |
| WO | WO 00/55665 | 9/2000 |
| WO | 01/27989 A1 | 4/2001 |
| WO | WO 02/056077 A2 | 7/2002 |
| WO | 2006/047190 A1 | 5/2006 |

OTHER PUBLICATIONS

International Search Report and Written Opinion from US/PCT2005/037628, mailed Mar. 9, 2006, 13 pages.

"Microprocessor Package Integrated Optical Solution," Intel Technology Journal, vol. 8, Issue 2, Published May 10, 2004, ISSN 1535-864X, pp. 1-10.

First Office Action received for European Patent Application No. 05825677.7, Mailed on Dec. 4, 2008, 6 pages.

Second Office Action received for European Patent Application No. 05825677.7, Mailed on Feb. 5, 2010, 7 pages.

Office Action received for Japanese Patent Application No. 2007-538013, Mailed on Aug. 18, 2009, 5 pages including English translation.

International Preliminary Report on Patentability and Written Opinion received for PCT Application No. PCT/US2005/037628, mailed on May 3, 2007, 7 pages.

Office Action received for Japanese Patent Application No. 2007-538013, Mailed on Apr. 20, 2010, 4 pages of Office Action including 2 pages of English translation.

Office Action Received for European Patent Application No. 05825677.7, mailed on Nov. 4, 2010, 4 Pages of Office Action.

Office Action Received for European Patent Application No. 10183548.6, mailed on Dec. 12, 2010, 2 Pages of Office Action.

Office Action Received for Japanese Patent Application No. 2007-538013, mailed on Oct. 26, 2010, 3 Pages of English Translation and 2 pages of Office Action.

Extended European Search Report Received for European Patent Application No. 10183548.6, mailed on Nov. 9, 2010, 9 Pages of European Search Report.

Office Action for European Patent Application No. 10183548.6-1524, mailed Dec. 16, 2011, 6 pages.

International Preliminary Report on Patentability from PCT/US2005/037628 mailed May 3, 2007, 7 pages.

* cited by examiner

US 8,412,052 B2

SURFACE MOUNT (SMT) CONNECTOR FOR VCSEL AND PHOTODIODE ARRAYS

FIELD OF THE INVENTION

Embodiments of the present invention relate to connectors and, more particularly, to surface mount connectors for optoelectronic devices.

BACKGROUND INFORMATION

With the proliferation of optical communication systems the use of small fiber optic connectors has become more prevalent. Optical connectors are typically made of plastic and are useful components for joining optical fibers or waveguide arrays at their ends. Optical connectors are typically pluggable, meaning that they may allow for repeated connection and disconnection. There are many types of optical connectors available on the market today.

FIG. 1 shows an example a Mechanically Transferable or "MT"-style connector. Some also refer to "MT" as Multi-Terminal connectors. MT connectors are one type of what are known as small form factor (SFF) connectors. MT connectors are popular for parallel optical data transmission since they provide a high fiber count in a dense connector package comprising an arrayed configuration of fiber holes aligned in a single ferrule. Commercially available MT connectors may comprise anywhere from two to twenty-four connection points and in the future will likely comprise many times that number.

Referring to FIGS. 1 and 2 there is shown an example of an MT-style connector. FIG. 1 shows a female portion 100 and a male portion 102 of the connector. FIG. 2 shows a more detailed plan view of the female portion 100. A female input 101 and a male input 103 may comprise either optical fibers or waveguide arrays intended to be optically connected to each other. Both the female portion 100 and the male portion 102 hold arrays of corresponding exposed optical connection points 104 and 106 in ferrules, 108 and 110. The connection points 104 and 106 may be aligned by a pair of metal guide pins 112 at the end of the male portion 102, which join into guide holes 114 on the female portion 100. The MT connector may be locked together by a push and click mechanism or may comprise a fastener (not shown) that clips between the end 116 of the female portion 100 and the end 118 of the male portion 102.

DETAILED DESCRIPTION

Figure 1:
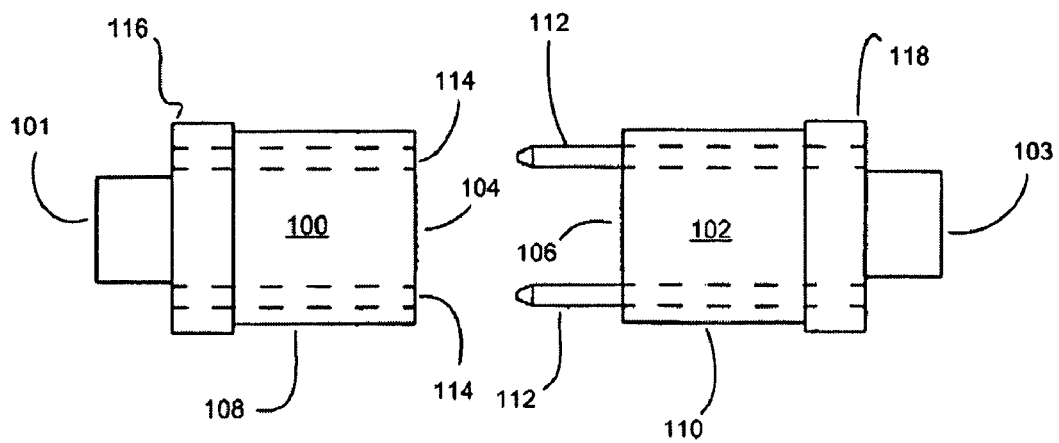
FIG. 1 is a Mechanically Transferable or "MT"-style connector.
Figure 2:
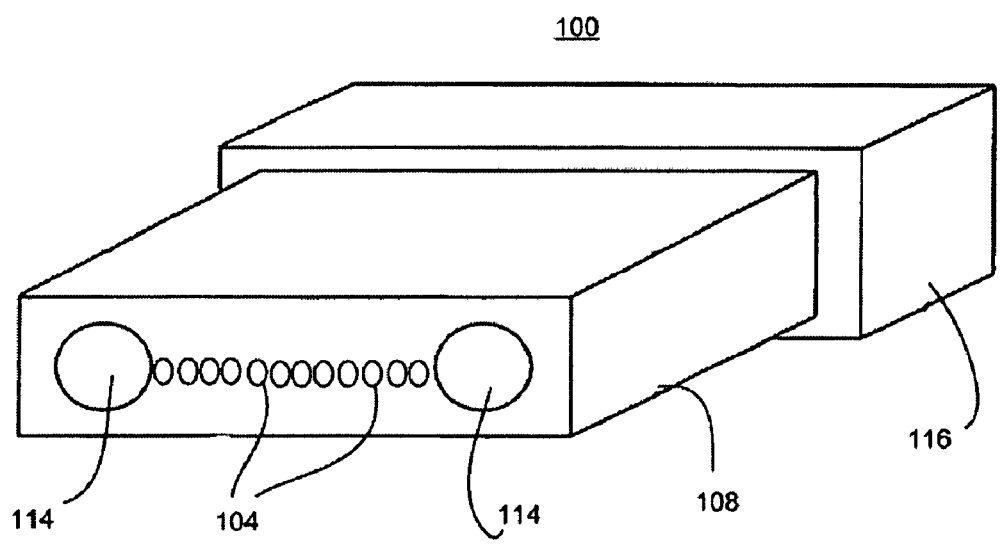
FIG. 2 is a plan view of a female portion of an MT-style connector.
Figure 3:
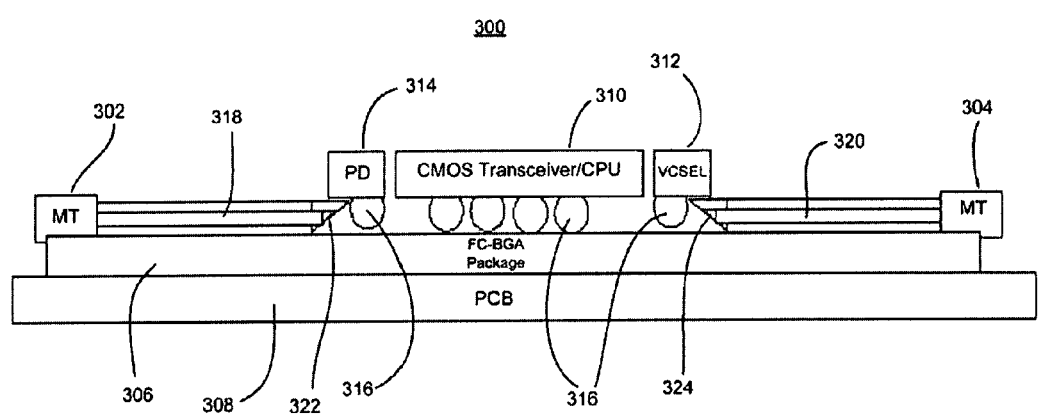
FIG. 3 is a side view of optical and electrical components on a flip-chip ball grid array (FC-BGA) package.

Referring now to FIG. 3, there is shown a side view of an optical transceiver 300 that utilizes MT-style connectors 302 and 304. As shown, a flip-chip Ball/Grid Array (FC-BGA) substrate 306 may be mounted to a printed circuit board (PCB) 308. The FC-PGA substrate 306 may have attached thereto a Complementary Metal Oxide Semiconductor (CMOS) transceiver 310 including circuitry for driving a vertical cavity surface emitting laser (VCSEL) array module 312 as well as receiver circuitry for receiving signals from a photo-diode (PD) array module 314. Transceiver 310, the VCSEL module 312, and the PD module 314 may be flip-chip bonded to the FC-PGA substrate 306 via solder ball arrays 316.

A first polymer waveguide array 318 couples incoming light signals from the MT-style connector 302 to the PD module 318. The PD module 318 translates the incoming light signals into electrical signals for the transceiver 310. Likewise, electrical signals for transmission from the transceiver 310 are supplied to the VCSEL module 312. A second polymer waveguide array 320 couples light signals output by the VCSEL module 312 to the MT-style connector 304.

One end of the of each of the first and second polymer waveguide arrays, 318 and 320, are configured at a 45° angle and coated with reflective materials to form a first total internal reflection (TIR) mirror 322 and a second TIR mirror 324. This may be accomplished by cutting or slicing the waveguide array, 318 or 320, at a 45° angle using, for example, microtoming or laser ablation techniques. In this manner incoming light signals from the MT-style connector 302 travel down the first waveguide 318 and are reflected 90° upwards by the TIR mirror 322 to the PD module 314. Similarly, light emerging from the bottom of the VCSEL module 312, perpendicular to the PCB 308, are reflected at a 90° angle by the TIR mirror 324 and into the second waveguide 320 and to the MT-style connector 304. The waveguide arrays 318 and 320 should be accurately aligned to bumps on the FC-BGA substrate 306 and attached. With this configuration, visual alignment may be used for alignment of the optoelectronic chips such as VCSEL module 312 and the PD module 314.

Figure 4:
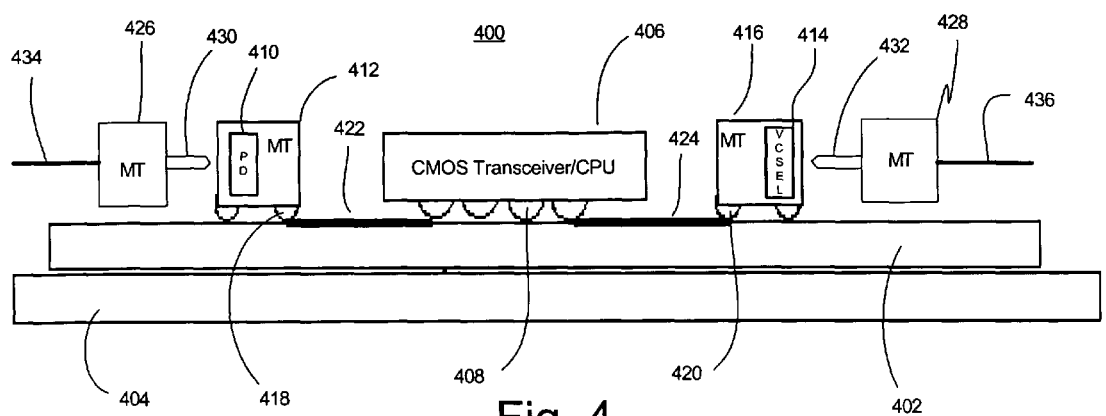
FIG. 4 is a side view of a of optical and electrical components on a flip-chip ball grid array (FC-BGA) package according to embodiments of the invention.

One embodiment of the invention comprises eliminating visual alignment by packaging the optoelectronic chips such as the VCSEL module 312 or the PD module 314 directly into an MT-style connector. FIG. 4 shows an optical transceiver 400 similar to the transceiver 300 shown in FIG. 3 with the elimination of the waveguides 318 and 320 and TIR mirrors 322 and 324, and having the PD module 410 and the VCSEL module 414 integrated directly into the optical connectors 412 and 416, respectively.

The optical transceiver 400 of FIG. 4 may comprise a FC-BGA substrate 402 on a printed circuit board 404. The FC-BGA substrate 402 may comprise a multi-layer organic substrate with multiple electric traces at each level connected by conductive vias between the layers (not shown). A CMOS transceiver 406 may be flip-chip bonded to the FC-BGA substrate 402 via solder ball array 408. The optical transceiver 400 as shown may be, for example, a high-speed, 12-channel parallel optical transceiver package and may be compatible with microprocessor package technology and at the same time allow the integration of low-cost, high-performance optical components. The CMOS transceiver 406 may be fabricated in a 0.18 μm CMOS process technology, and contain all the circuits needed for use in optical link communication such as VCSEL drivers, transimpedance amplifiers (TIAs), and limiting amplifiers (LIAs) and may form part of a central processing unit (CPU) package. While 0.18 μm CMOS process technology is offered as an example, other process technologies may also be used.

A photo-diode (PD) array module 410 may also be packaged inside of an MT-style connector to form an MT-style photo diode (PD) package 412. Similarly, a vertical cavity surface emitting laser (VCSEL) array module 414 may also be packaged inside of an MT-style connector to form an MT-style VCSEL package 416. The MT-style PD package 412 and the MT-style VCSEL package 416 may be surface mount (SMT) devices using solder ball arrays 418 and 420 to be flip chip mounted to the FC-PGA substrate 402. Conductive traces, such as those illustrated by 422 and 424, may be used to electrically connect the MT-style PD package 412 and the MT-style VCSEL package 416 to the CMOS transceiver 406.

The MT-style PD package 412 and the MT-style VCSEL package 416 as shown are packaged in female MT-style connectors. Male MT-style connectors, 426 and 428, comprise alignment pins 430 and 432, which permit direct butt-coupling of an external waveguide or fiber array, 434 and 436. Of course, it is understood that this may be reversed and the PD package 412 and the MT-style VCSEL package 416 may be packaged in male MT-style connectors to be mounted to the FC-BGA substrate 402 and the connectors 426 and 428 may be female MT-style connectors.

Embodiments thus allow for self alignment of Optoelectronic (OE) chips, such as PD modules 410 and VCSEL modules 414 and external waveguides or fiber arrays 434 and 436 by packaging the OE chips directly in the MT style fiber optical connector.

The MT style connector has alignment pins, 430 and 432, which allow any MT connectorized flying waveguide or fiber array to plug in to it. Since the optic axis of the optoelectronic array chips and the waveguide arrays are aligned, the arrangement permits direct butt-coupling. Neither turning mirrors nor any on-package waveguides are used. According to one embodiment VCSEL arrays may be flip-chip mounted on a glass substrate patterned with electrodes and bumps that are used as electrical contacts. Typically the glass substrate will be larger in size than the size of the array chip. The combined unit is aligned to a plastic package.

Figure 5A:
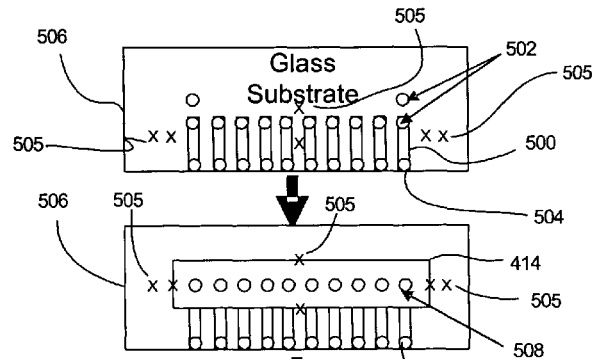
FIGS. 5A, 5B, and 5C illustrate an exemplary fabrication process for packaging an optoelectronic chip-in an optical connector.
Figure 5B:
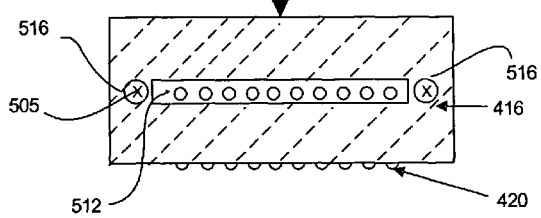
Figure 5C:
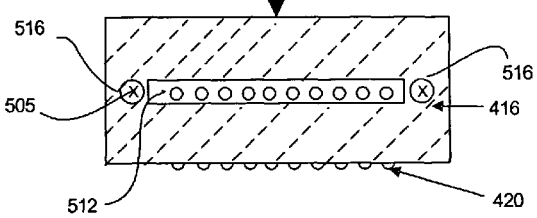

FIGS. 5A, 5B, and 5C show an exemplary process flow for fabricating an optoelectronic array chip in an MT-connector. As shown in FIG. 5A, electrodes 500 and solder bumps, 502 and 504, may be patterned on a glass substrate 506. In this example upper rows of solder bumps 502 and a lower row of solder bumps 504 are shown connected by electrodes 500. The electrodes 500 and solder bumps 502 and 504 may be patterned with existing semiconductor fabrication techniques. Alignment marks 505 may also be provided on the glass substrate 506.

Referring to FIG. 5B, an optoelectronic (OE) module 414, such as a VCSEL array module, may be flip-chip bonded to the upper rows of solder bumps 502. The alignment marks 505 may be used to facilitate the alignment position of the OE module 414 with respect to the glass substrate 506. In one embodiment, the VCSEL array module 414 may comprise ten VCSELs illustrated by the ten apertures 508. However, the number of VCSELs in the VCSEL array module 414 may be more or less depending on the application. While a VSCEL array module 414 is discussed, this may just as easily comprise any optoelectronic chip, such as a photodiode array 410 as shown in FIG. 4.

FIG. 5C comprises a front view of the MT-style connector 416 shown in FIG. 4, the substrate 506 may be packaged in an MT-style connector housing 416 which may comprise a generally rectangular opening 512 exposing the apertures 512. The housing 416 may comprise plastic, for example. Again, the alignment marks 505 may be used to facilitate alignment of the substrate within the housing 416. The lower row of solder bumps 504 may correspond to the solder bumps 420 on the bottom of the package for inputting and outputting electric signals and power to the array module 414. Guide holes 516 may be provided for mating guide pins (432 of FIG. 4) of a complimentary MT-style connector 428.

Figure 6:
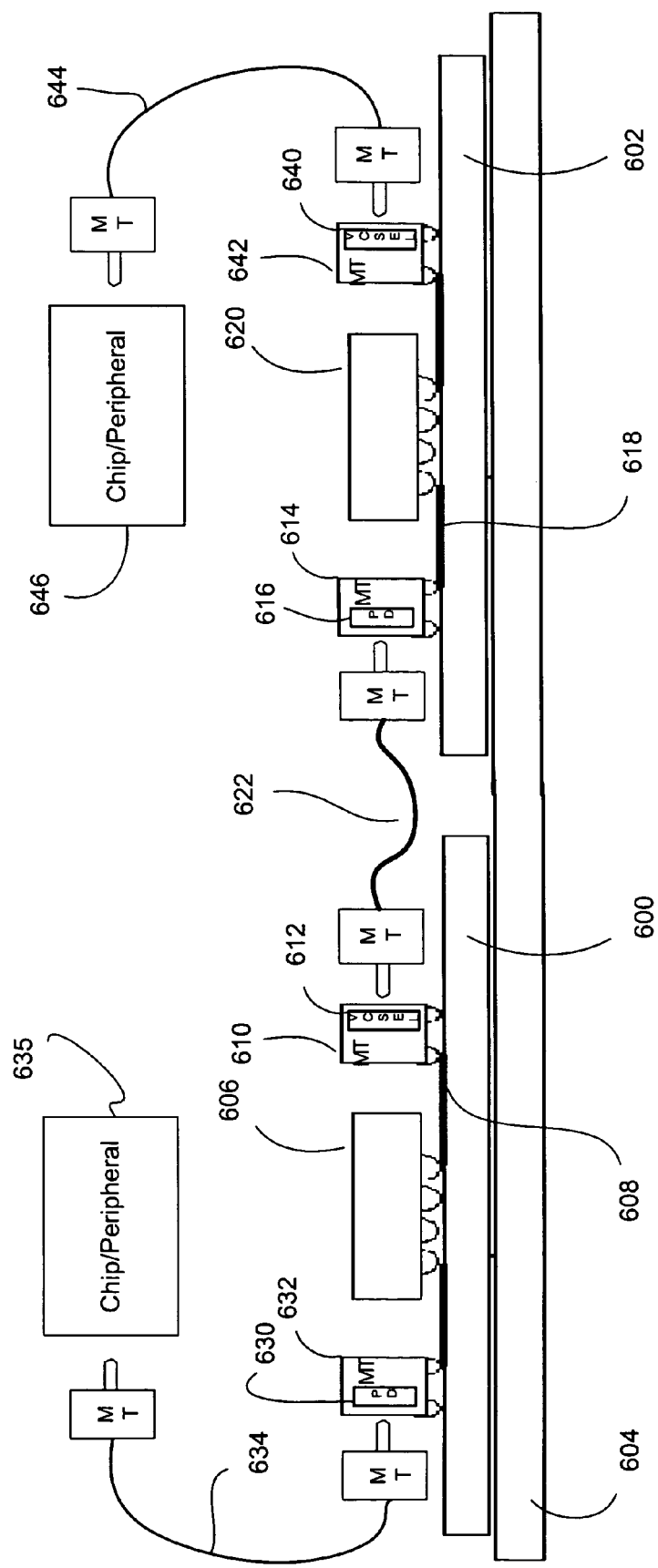
FIG. 6 is a view of optical connectors with built-in optoelectronic devices used for internal chip-to-chip optical interconnects as well as external optical interconnects.

FIG. 6 illustrates embodiments of the present invention used for chip-to-chip optical interconnect such as may be used in a central processing unit (CPU) package. Here, two or more chips 600 and 602 may reside on a common board or package 604. The first chip 600 may include a transceiver 606 electrically connected by a trace 608 to a connector 610 having a built-in VCSEL array module 612. Similarly, the second chip 602 may comprises a connector 614 having a built-in photo-diode (PD) array module 616 electrically connected by trace 618 to a transceiver 620. In this manner a chip-to-chip optical interconnect may be realized using a fiber optic connector cord, such as male-male connector 622.

Optionally each chip 600 and 602 may also include complimentary transceiver components. For example, in one embodiment chip 600 may include a PD array module 630 built into a connector 632 to receive external optical signals from another chip (not shown) within the package 604 or from an external source such as an external chip or peripheral 635, such as a memory or router. Likewise, the chip 602 may include a VCSEL array module 640 built into a connector 642 to transmit optical signals 644 to another chip within the package 604 or residing in an external chip or peripheral device 646.

According to embodiments of the invention, coupling light from/to optoelectronic components is facilitated since the optic axis of the optoelectronic components and fiber or waveguide arrays can be easily aligned. By packaging the optoelectronic module within the connector, direct coupling is possible instead of using other aids such as mirrors. Excess loss resulting from the turning mirrors may be eliminated at both transmitter and receiver interfaces resulting in the reduction of the optical loss budget of the system. Further, embodiments of the invention may be compatible with high volume manufacturing (HVM) since alignment and assembly of the OE module and the glass substrate may be done at the wafer level.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A system comprising:
    a laser packaged within a first optical connector housing mounted to a first substrate and electrically coupled to a first electronic chip, the first optical connector housing being shaped as a mechanically transferable type (MT-type) connector, the laser being part of a laser module mounted on the first substrate, the module being flip-chip bonded to connections on the first substrate, and the substrate being packaged inside the first optical connector housing with apertures of the first substrate exposed through the first optical connector housing;

solder bumps on the first optical connector housing for making flip-chip connections to the first substrate;

a photodiode packaged within a second optical connector housing mounted to a second substrate and electrically coupled to the second substrate, the second optical connector housing being a mechanically transferable type (MT-type) connector, the photodiode being part of a photodiode module mounted on the second substrate, the module being flip-chip bonded to connections on the second substrate, and the second substrate being packaged inside the second optical connector housing with apertures of the second substrate exposed through the second optical connector housing;

solder bumps on the second optical connector housing for making flip-chip connections to the second substrate; and an optical fiber cord having optical connectors at either end to mate with the first optical connector housing and the second optical connector housing to direct butt-couple the optical fiber cord to the laser and the photodiode and optically connect the laser to the photodiode.

2. The system as recited in claim 1, further comprising: transmitter circuitry electrically connected to the laser; and receiver circuitry electrically connected to the photodiode.

3. The system as recited in claim 2 wherein the laser transmits signals to a complementary optical component of a peripheral module.

4. The system as recited in claim 2 wherein the photodiode receives signals from a complementary optical component of a peripheral module.

5. The system as recited in claim 4, wherein in the peripheral module comprises a memory.

6. A method, comprising:

housing a laser in a first surface mount (SMT) connector, the laser being part of a laser module mounted on a first substrate, the module being flip-chip bonded to connections on the first substrate, and the first substrate being packaged inside the first SMT connector with apertures of the first substrate exposed through the first SMT connector;

flip-chip bonding the first SMT connector to a first substrate electrically coupled to a first electronic chip;

housing a photodiode (PD) in a second SMT connector, the photodiode being part of a photodiode module mounted on a second substrate, the module being flip-chip bonded to connections on the second substrate, and the second substrate being packaged inside the second SMT connector with apertures of the second substrate exposed through the second SMT connector;

flip-chip bonding the second SMT connector to a second substrate electrically coupled to a second electronic chip;

direct butt-coupling an optical cord to the laser and the photodiode and optically connecting the first electronic chip with the second electronic chip via an optical cord plugged into the first SMT connector and the second SMT connector.

7. The method as recited in claim 6 wherein the first electronic chip and the second electronic chip reside in a central processing unit (CPU) package.

8. The method as recite in claim 6 wherein the laser transmits signals from an electronic package to a complementary optical component of a peripheral device.

9. The method as recited in claim 6 wherein the photodiode receives signals at an electronic package from a complementary optical component of a peripheral device.

10. The method as recited in claim 6 wherein the first substrate and the second substrate are the same substrate.

\* \* \* \* \*